United States Patent [19]
Nawaki et al.

[11] Patent Number: 5,602,777
[45] Date of Patent: Feb. 11, 1997

[54] SEMICONDUCTOR MEMORY DEVICE HAVING FLOATING GATE TRANSISTORS AND DATA HOLDING MEANS

[75] Inventors: Masaru Nawaki, Nara; Shounosuke Ueno, Osaka, both of Japan

[73] Assignee: Sharp Kabushiki Kaisha, Osaka, Japan

[21] Appl. No.: 449,022

[22] Filed: May 24, 1995

[30] Foreign Application Priority Data

Sep. 28, 1994 [JP] Japan .................................. 6-233743

[51] Int. Cl.⁶ .................................................. G11C 16/02
[52] U.S. Cl. .................. 365/185.09; 365/49; 365/185.21
[58] Field of Search ...................... 365/185.07, 185.09, 365/185.18, 185.21, 185.24, 49

[56] References Cited

U.S. PATENT DOCUMENTS

| | | | |
|---|---|---|---|
| 5,031,142 | 7/1991 | Castro | 365/49 |
| 5,046,046 | 9/1991 | Sweha | 365/185.09 |
| 5,200,922 | 4/1993 | Rao | 365/185.09 |
| 5,267,213 | 11/1993 | Sung et al. | 365/226 |

*Primary Examiner*—David C. Nelms
*Assistant Examiner*—Son Mai
*Attorney, Agent, or Firm*—Morrison & Foerster LLP

[57] ABSTRACT

In a semiconductor memory device, a data holding unit is disposed separately from the first and second floating gate transistors. A voltage difference is generated by the difference between the threshold voltages of the first and second floating gate transistors, and the voltage difference is stored in the form of a binary data. Thereafter, the first and second floating gate transistors are turned off. Thus, a minute current which always flows through the first and second floating gate transistors in the conventional technique is prevented from being generated so that the power consumption is reduced. In addition, data is fetched from the data holding unit while the bias voltage generating units are turned off. Thus, the time period of operating the bias voltage generating units is eliminated so that the memory device can operate at a high speed.

5 Claims, 8 Drawing Sheets

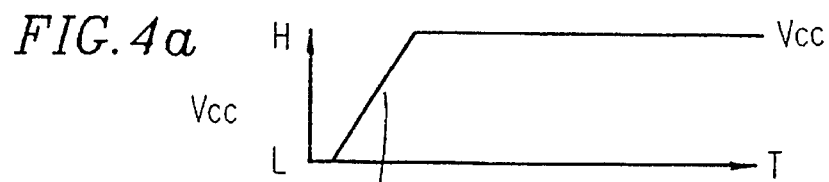
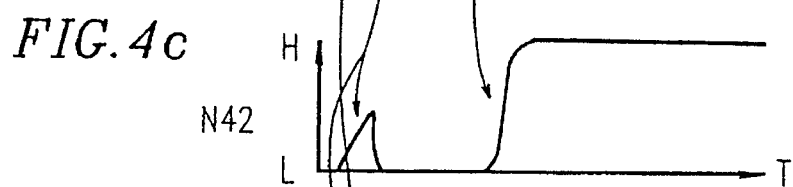
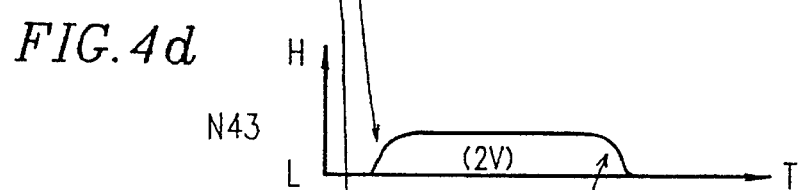
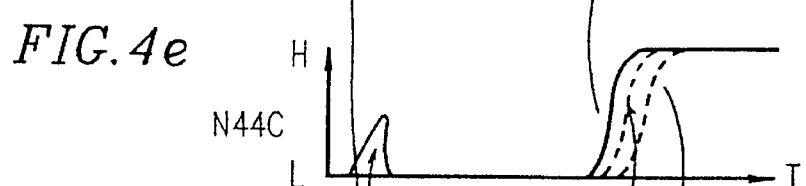
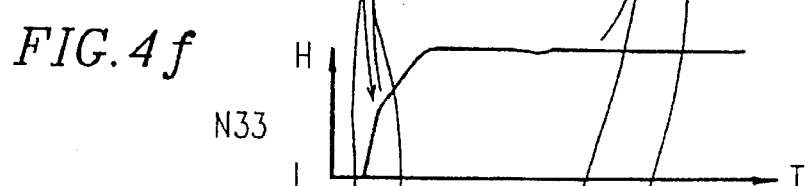
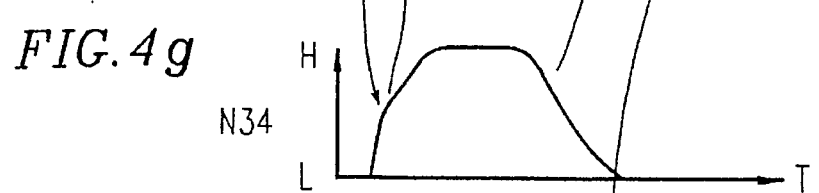
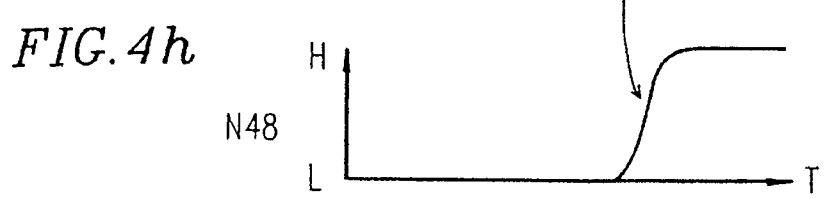

SEMICONDUCTOR MEMORY DEVICE HAVING FLOATING GATE TRANSISTORS AND DATA HOLDING MEANS

BACKGROUND OF THE INVENTION

1. Field of the Invention

The invention relates to a semiconductor memory device having floating gate transistors which are used for holding data such as redundance replacement addresses, a device initial state and the like.

2. Description of the Related Art

In a large capacity memory device, replacement of defective memory cells is conducted using a redundant circuit, as means for relieving the device from failures due to defects of memory cells. Such a redundant circuit includes reserved memory cells which, when there exist defective memory cells, are to substitute for the defective memory cells, and a circuit which stores the addresses of the defective memory cells (hereinafter, referred to as "defective addresses") and replaces the defective memory cells with the reserved memory cells. Generally, one of the following two methods is employed as a method of storing such defective addresses, depending on types of devices.

In a volatile memory device such as a DRAM or an SRAM, employed is a method in which a plurality of fuses formed by polysilicon or a metal are arranged in the device and the fuses are selectively disconnected by electrical means, a laser beam or the like, thereby storing defective addresses. On the other hand, in an EPROM or a flash memory, defective addresses are stored by using the memory cells in place of fuses, since such memory cells themselves are nonvolatile.

The aforementioned methods are also applicable to a memory element which is used for storing the initial state of a device.

FIG. 7 is a circuit diagram of an exemplary conventional redundant defective address memory circuit which is used in a conventional EPROM or flash memory. The memory circuit is described in detail in U.S. Pat. No. 5,267,213.

In FIG. 7, a CAM (Contents Addressable Memory) cell 1 is a defective address memory circuit which can store one bit of a defective address, and includes two floating gate transistors 2 and 3, N-transistors 4 through 7 and P-transistors 8 and 9. Usually, such a memory circuit is called a CAM cell, and a group of CAM cells is called a CAM. The gates of the floating gate transistors 2 and 3 in the CAM cell 1 are commonly connected to a bias voltage generating circuit 10 so that a bias voltage is supplied to the gates of the floating gate transistors 2 and 3. The gates of the N-transistors 4 and 5 are commonly connected to a bias voltage generating circuit 11 so that a bias voltage is supplied to the gates of the N-transistors 4 and 5. A series circuit of the P-transistor 8, the N-transistor 4, and the floating gate transistor 2 is interposed between a Vcc potential and a Vss potential. Similarly, a series circuit of the P-transistor 9, the N-transistor 5, and the floating gate transistor 3 is interposed between the Vcc potential and the Vss potential. The gate of the P-transistor 8 is connected to the junction of the P-transistor 9 and the N-transistor 5, and the gate of the P-transistor 9 is connected to the junction of the P-transistor 8 and the N-transistor 4. The drains of the N-transistors 6 and 7 are commonly connected to an output terminal of a current supply circuit 12, and the gates of the N-transistors 6 and 7 are connected to a decoder circuit 13. The source of the N-transistor 6 is connected to the junction of the floating gate transistor 2 and the N-transistor 4, and the source of the N-transistor 7 is connected to the junction of the floating gate transistor 3 and the N-transistor 5. A plurality of CAM cells 1 (for example, n CAM cells 1-1 to 1-n as indicated in FIG. 7) each having the above-mentioned configuration are arranged. Each of the CAM cells outputs data from an output N4 which is a junction of the P-transistor 9 and the N-transistor 5.

Hereinafter, the operation of the above-mentioned configuration will be described.

First, a method of storing a defective address in the memory circuit 1 will be described. As an example, the case where "0" is stored (programmed) in the CAM cell 1 (N4="0") will be described.

All the floating gate memory cells in the CAM cell 1 have been subjected to the UV erasing (ultraviolet light erasing) so that the threshold voltage (hereinafter, referred to as Vth) is neutralized to be about 2 to 3 V. Generally, the bias voltage generating circuits 10 and 11 output an intermediate potential and a Vcc potential, respectively. When the programming is to be done, the output N10 of the bias voltage generating circuit 10 is set to be a high voltage of 10 V or higher, and the bias voltage of the output N11 of the bias voltage generating circuit 11 is lowered to the Vss level, so that the N-transistors 4 and 5 are turned off, resulting in that only an output N13-1a among the outputs of the decoder 13 is raised to about 7 to 8 V. An output N13-1b of the decoder 13 is used only during another programming.

Under this state, during a given period, an output N12 of the current supply circuit 12 is raised to a high voltage of about 10 to 12 V. In this case, the transistor 7 is turned off and only the transistor 6 is turned on. Therefore, a voltage of about 6 to 7 V is applied via the transistor 6 to the output N1 in the drain side of the floating gate transistor 2, and a current flows between the drain and source of the floating gate transistor 2. Hot electrons generated by the current are caused to be injected into the floating gate of the transistor 2, by the output N10 which functions as the bias voltage applied to the transistor 2, thereby raising the Vth of the transistor 2. The Vth is raised to a level approximately equal to or higher than the Vcc potential. The Vth of the transistor 3 remains to be neutralized to be about 2 to 3 V. In this way, the difference of the Vth levels of the transistors 2 and 3 causes "0" to be stored in the CAM cell 1. The above is strictly identical with the writing process of a usual hot electron injection EPROM or flash memory.

Next, the case where "1" is stored (programmed) in the CAM cell 1 (N4="H") will be described.

Only an output N13-1b of the decoder 13 is set to be higher than the Vcc potential. Under this state, during a given period, the output N12 of the current supply circuit 12 is raised to a high voltage of about 10 to 12 V. In this case, the transistor 6 is turned off and only the transistor 7 is turned on. Therefore, a voltage of about 6 to 7 V is applied via the transistor 7 to the node N2 in the drain side of the floating gate transistor 3, and a current flows between the drain and source of the floating gate transistor 3. Thus, in the same manner as described above, the Vth of the transistor 3 is raised. The Vth of the transistor 2 remains to be neutralized to be about 2 to 3 V. In this way, the difference of the Vth levels of the transistors 2 and 3 causes "1" to be stored in the CAM cell 1.

The above-mentioned operations are conducted on all the CAM cells 1 in the CAM before shipment of the device, so that "0" or "1" is respectively stored (programmed) in each of the CAM cells.

Next, the case where a device shipped after the programming described above is used by the user will be described. It is assumed that, in this case, "0" (N4="L") is stored (programmed) in the CAM cell 1.

When the device is powered on, the output N10 of the bias potential is set to be the Vcc potential and the output N11 of the bias potential is raised to a potential which is approximately twice (about 2 V) the threshold voltage of the transistors 4 and 5, whereby the transistors 4 and 5 are made turned on. At this time, the output N10 which functions as the gate potential of the transistors 2 and 3 is at the Vcc potential, which is at an intermediate level higher than the Vth of the transistor 3 and lower than that of the transistor 2. Thus, the transistor 3 allows a current to pass therethrough and the transistor 2 is turned off. Therefore, the output N4 is pulled down to the "L" level by the transistors 3 and 5. The output N4 is connected to the gate of the transistor 8. When the output N4 is lowered to the "L" level, therefore, the transistor 8 is turned on. Since the transistor 2 is turned off, however, the output N3 is completely pulled up to the Vcc level. The pull-up of the output N3 to the Vcc level causes the transistor 9 which uses the output as the gate potential, to become turned off so that the output N4 is completely set to the Vss level. In this state, the outputs N3 and N4 are completely set to the Vcc and Vss levels, respectively, and hence a DC current cannot flow any longer. As a result, "0" (N4="L") is output from the output N4.

In the case where "1" (N4="H") is to be output from the output N4, the relationship between the Vth levels of the transistors 2 and 3 is inverted, and the subsequent operations are the same as those described above.

In the above, the operation of the CAM cell 1 has been described. After the device is powered on, the CAM cell 1 is latched to this state. All the other CAM cells 1 are latched in the same manner, and "1" or "0" is output from the respective outputs N4.

The conventional CAM cells 1 described above have the following problems.

In U.S. Pat. No. 5,267,213, the improved bias voltage generating circuit 11 has a configuration shown in FIG. 8. In the circuit, a current to be consumed can be reduced in level, and the period to be elapsed until the output reaches a specified value can be shortened. Actually, however, a minute DC current must flow through a series circuit of the transistors 14 and 15 in order to obtain a stable output voltage. When such a supply of a DC current is to be completely eliminated, a power-down signal must externally be supplied to power off the circuit. However, this countermeasure has a drawback that, when the circuit is next powered on, the operations of the transistors, etc. require a short period to be elapsed until the output reaches the specified value, resulting in that the access time is prolonged in the case of a memory.

Another problem is as follows: In the CAM cell 1, when the Vcc potential exceeds the Vth of the floating gate transistor 2 (the transistor having a higher Vth) which is programmed so as to be raised, or, for example, when Vcc=5.5 V and Vth=5.3 V, the potential of the output N10 of the bias voltage generating circuit 10 becomes Vcc, and hence the transistor 2 which should be turned off is turned on. At this time, since the transistor 3 is turned on and the output N4 is at the L level, the transistor 8 is turned on. Since the transistor 4 is originally turned on, a DC current flows from the Vcc potential to the Vss potential through the series circuit of the transistors 8, 4 and 2. Although each DC current flowing through the respective CAM cell 1 is very low in level, the use of plural CAM cells 1 in the whole of device causes the DC currents to be accumulated, and the resulting DC current level is so large that the stand-by current of the device is adversely affected.

In a countermeasure of preventing a DC current from flowing even in the case where the Vcc potential is high, the Vth of a floating gate transistor to be programmed is set to be high. In order to conduct the countermeasure, however, the output N10 of the bias voltage must be set to be high during the process of programming the CAM cell 1. This produces problems of dielectric strength and reliability of the transistors 2 and 3.

Another countermeasure may be considered in which the potential of the output N10 is always set to be lower than the Vcc potential by a fixed voltage. However, the provision of a circuit which always sets the output to be lower than the Vcc potential by the fixed voltage produces the following problem. When the Vcc potential is lowered, or, for example, when the output N10 of the bias voltage is set to be lower than the Vcc potential by 1 V and the Vcc potential is lowered to about 3 V, the potential of the output N10 becomes about 2 V. Then, the transistor 3 which must usually be turned on becomes turned off because the Vth of the transistor is about 2 to 3 V, with the result that the CAM cell can no longer correctly operate.

It may be possible to design a circuit which can lower the voltage of the output N10 only when the Vcc potential is high. However, this involves an addition of a further bias voltage generating circuit which naturally consumes a large current. Since such a circuit itself consumes a DC current, the circuit hinders the original object of reducing the stand-by current to a level as low as possible.

In other words, when a such a CAM circuit is used for holding (latching) data (addresses), a conventional system requires the holding portion to be kept activated during the process of outputting the stored (programmed) data. Accordingly, the bias voltage generating circuits 10 and 11 for the holding circuit must always be turned on. The turn-on operation of the bias voltage generating circuits produces a problem in that a current is consumed, and requires a prolonged period when, in the process of reading out the data, the bias voltage generating circuits 10 and 11 are first turned on so that the data is determined by the holding circuit.

SUMMARY OF THE INVENTION

The semiconductor memory device of this invention includes: a first floating gate transistor and a second floating gate transistor each storing charges, the amount of the charges stored in the first floating gate transistor being made different from that stored in the second floating gate transistor; at least one controlling means for generating a voltage difference in accordance with respective threshold voltages of the first and second floating gate transistors, and for then turning off the first and second floating gate transistors; and at least one data holding means for holding the voltage difference as a binary data.

In one embodiment the control means detects completion of sensing operation of the data holding means, and turns off the first and second floating gate transistors after the detection.

In another embodiment, the control means further includes at least one switching device provided as corresponding to each of the data holding means, the switching device being connected to a line pulled up to a first potential level, the switching device pulling down the potential level of the line to a second potential level, and the control means drives the switching device using an output of the detection indicative of the voltage difference between the respective threshold voltages of the first and second floating gate transistors, and detects the completion of the sensing operation of the data holding means by detecting that each of the switching devices have been driven.

In still another embodiment, the control means further includes: a first bias voltage generating means for supplying a bias voltage to a gate of each of the first and second floating gate transistors; a first transistor of a first conductive type connected upstream to the first floating gate transistor in series; a second transistor of the first conductive type connected upstream to the second floating gate transistor in series; a second bias voltage generating means for supplying a bias voltage to a gate of each of the first and second transistors of the first conductive type, and wherein the first and second transistors of the first conductive type are turned off, thereby turning off the first and second floating gate transistors.

In still another embodiment, the data holding means is connected between a first potential level and a second potential level via a switching transistor, the first floating gate transistor is connected to the data holding means via the first transistor of the first conductive type, the second floating gate transistor is connected to the data holding means via the second transistor of the first conductive type, and the control means, when difference between the first and second potential levels changes beyond a predetermined extent, turns on the first and second transistors of the first conductive type so as to supply a current to the first and the second floating gate transistors, and thereafter turns on the switching transistor so as to turn off the first and second transistor of the first conductive type in a synchronizing manner with decreasing of a drain voltage of either the first and second transistors of the first conductive type to a prescribed intermediate level between the first and second potential levels.

In still another embodiment, the data holding means further includes: a series circuit of a first transistor of a second conductive type and a third transistor of the first conductive type; a parallel circuit of a second transistor of the second conductive type and a fourth transistor of the first conductive type, wherein a gate of the first transistor of the second conductive type and a gate of the third transistor of the first conductive type are connected to a junction between the second transistor of the second conductive type and the fourth transistor of the first conductive type, wherein a gate of the second transistor of the second conductive type and a gate of the fourth transistor of the first conductive type are connected to a junction between the first transistor of the second conductive type and the third transistor of the first conductive type, and wherein a voltage is applied to the first and second transistors of the second conductive type.

Thus, the invention described herein makes possible the advantage of providing a semiconductor memory device capable of operating at a high speed with a low power consumption and without suffering from variation in a power supply voltage.

This and other advantages of the present invention will become apparent to those skilled in the art upon reading and understanding the following detailed description with reference to the accompanying figures.

BRIEF DESCRIPTION OF THE DRAWINGS

FIGS. 4a to 4h are diagrams respectively illustrative of voltage waveforms in the semiconductor memory device shown in FIG. 1, indicating the operation thereof.

DESCRIPTION OF THE PREFERRED EMBODIMENTS

Figure 1:
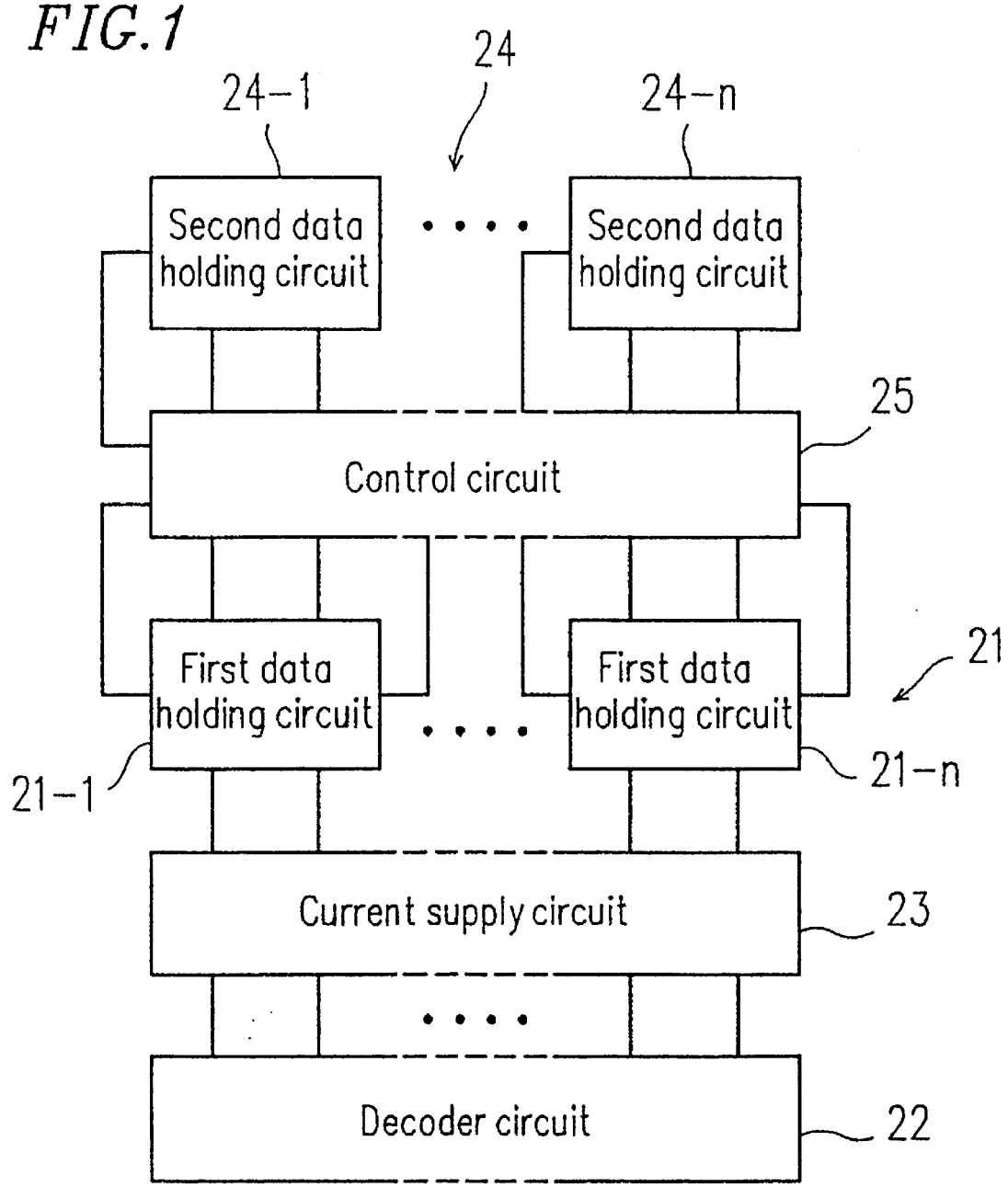
FIG. 1 is a block diagram of a semiconductor memory device in accordance with one embodiment of the invention.

FIG. 1 is a block diagram of a semiconductor memory device which is used in an EPROM or a flash memory in accordance with one embodiment of the invention.

In FIG. 1, each of plural first data holding circuits 21-1 to 21-n (n is a natural number; also collectively referred to as the first data holding circuit 21) is configured by combining two floating gate transistors. The amount of charge stored in the first floating gate transistor is made different from that in the second floating gate transistor, so that binary data are output using the difference between the threshold voltages Vth of the first and second floating gate transistors, respectively. A decoder circuit 22 is connected via a current supply circuit 23 to the first data holding circuits 21-1 to 21-n. In the programming process, a current is supplied to one of the first and second floating gate transistors so that the amount of charges stored in the first floating gate transistor of each of the first data holding circuits 21-1 to 21-n is made different from the amount of charges stored in the corresponding second floating gate transistor, thereby obtaining the difference between the Vth values of the transistors.

Second data holding circuits 24-1 to 24-n (n is a natural number; also collectively referred to as the second data holding circuit 24) are connected via a control circuit 25 to the first data holding circuits 21-1 to 21-n, respectively. The second data holding circuits 24 store the voltage differences due to the difference of the threshold voltages of the first and second floating gate transistors in each of the first data holding circuits 21, in the form of a binary data.

The control circuit 25 controls the first and second data holding circuits 21 and 24 in the following manner. The control circuit 25 generates voltage differences based on the differences of the Vth values of the first and second floating gate transistors, and thereafter makes the voltage differences held as binary data in the second data holding circuits 24. Further, the control circuit 25 controls the first and second floating gate transistors so as to be turned off.

Figure 2:
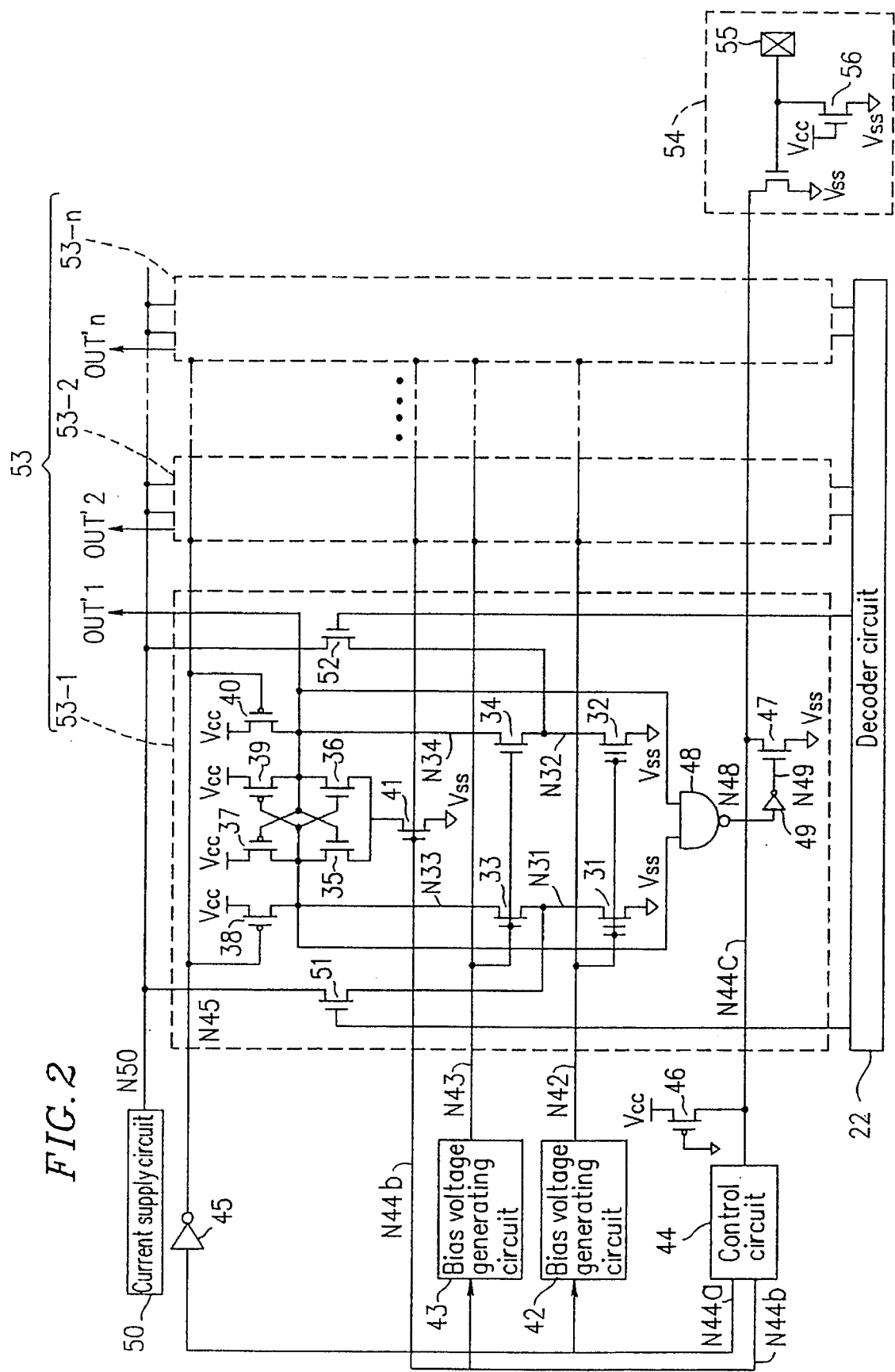
FIG. 2 is an exemplary circuit diagram of the semiconductor memory device shown in FIG. 1.

FIG. 2 is an exemplary circuit diagram of the semiconductor memory device of FIG. 1. In FIG. 2, each of floating gate transistors 31 and 32 includes a floating gate which is formed on a semiconductor substrate via an insulating film, a control gate which is capacitively coupled with the floating gate via the insulating film, and an impurity diffusion region provided in the substrate. The impurity diffusion region is connected to a portion of the substrate located under the floating gate and which has a conductivity type opposite to that of the substrate. Redundance replacement addresses, and other information used for setting the initial state of the product are stored in the transistors 31 and 32. Each of the first data holding circuits 21 is configured by combining the two transistors 31 and 32. The amount of charges stored in the floating gate of the transistor 31 is made different from that of charges stored in the floating gate of the transistor 32, whereby a binary voltage data is allowed to be output using the difference between their threshold voltages, i.e., Vth values.

The drain of the transistor 31 is connected to the source of a transistor 33 of a first conductivity type (in this example, N type), and the drain of the transistor 32 is connected to the source of a transistor 34 of the first conductivity type. The drain of the transistor 33 is connected to the drain of a transistor 35 of the first conductivity type, and the drain of the transistor 34 is connected to the drain of a transistor 36 of the first conductivity type. The drain of the transistor 33 is connected to the drains of transistors 37 and 38 of a second conductivity type (in this example, P type), and the drain of the transistor 34 is connected to the drains of transistors 39 and 40 of the second conductivity type.

The gates of the transistors 35 and 37 are connected to the drain of the transistor 36, and the gates of the transistors 36 and 39 are connected to the drain of the transistor 35.

The sources of the transistors 37 to 40 are connected to the Vcc potential. The sources of the floating gate transistors 31 and 32 are connected to the Vss potential. The sources of the transistors 35 and 36 are connected to the drain of a transistor 41 of a first conductivity type, and the source of the transistor 41 is connected to the Vss potential.

The transistors 35, 36, 37 and 39 constitute the second data holding circuit 24 having two complementary circuits. The second data holding circuit 24 can hold the voltage difference due to the difference between the Vth values of the transistors 31 an 32, in the form of a binary data.

The gates of the floating gate transistors 31 and 32 are connected to an output N42 of a bias voltage generating circuit 42, and the gates of the transistors 33 and 34 are connected to an output N43 of a bias voltage generating circuit 43. An output N44a of a control circuit 44 is connected to the gates of the transistors 38 and 40 via the bias voltage generating circuit 42 and an inverter 45. The transistors 38 and 40 are disposed in each of CAM cells 53 and supply a current to the transistors 33 and 34. An output N44b of the control circuit 44 is connected to the bias voltage generating circuit 43 and the gate of the transistor 41, and controls the on/off operation of the bias voltage generating circuit 43 and further the on/off operation of the second data holding circuit 24 via the transistor 41. The transistor 41 is disposed in each of the second data holding circuits 24 which are respectively disposed for the CAM cells 53, and connected at one terminal to the second data holding circuit 24 and at the other terminal to the Vss potential.

An input N44c of the control circuit 44 is pulled up by a transistor 46 of the second conductivity type, and pulled down by a transistor 47 of the first conductivity type. The transistor 47 is disposed for each of the CAM cells 53 in a wired-OR manner. The junction of the transistors 35 and 37 is connected to one input terminal of a NAND gate 48, and the junction of the transistors 36 and 39 is connected to the other input terminal of the NAND gate 48. The output terminal of the NAND gate 48 is connected to the gate of the transistor 47 via an inverter 49. The above-described configuration constitutes the data hold sensing unit so as to detect the completion of the sensing operation of each of the second data holding circuits 24-1 to 24-n.

An output N50 of a current supplying unit 50 is connected to the transistors 31 and 32 via transistors 51 and 52 of the first conductivity type so as to supply a current to the transistors 31 and 32. The gates of the transistors 51 and 52 are connected to output terminals of the decoder circuit 22 so as to be programmed by a control signal from the decoder circuit 22. The transistors 51 and 52 are disposed for each of the CAM cells 53, and cooperate with the current supplying unit 50 to constitute the current supply circuit 23.

As described above, the bias voltage generating circuits 42 and 43, the control circuit 44, the transistors 33, 34, 38, 40 and 41, the inverter 45, and the data hold detection unit constitute the control circuit 25. The control circuit 25 conducts the driving controls of the transistors 31 and 32, the transistors 33 and 34, the transistors 38 and 40 and the transistor 41, respectively. Thus, data are held by the second data holding circuits 24, and the bias voltage generating circuits 42 and 43 are turned off in accordance with the detection by the data holding detection unit. In the device, a plurality of the CAM cells 53 are disposed as enclosed by a broken line and indicated by reference numerals 53-1 to 53-n, respectively, in FIG. 2. Each of the CAM cells 53 includes the first and second data holding circuits 21 and 24.

Figure 3:
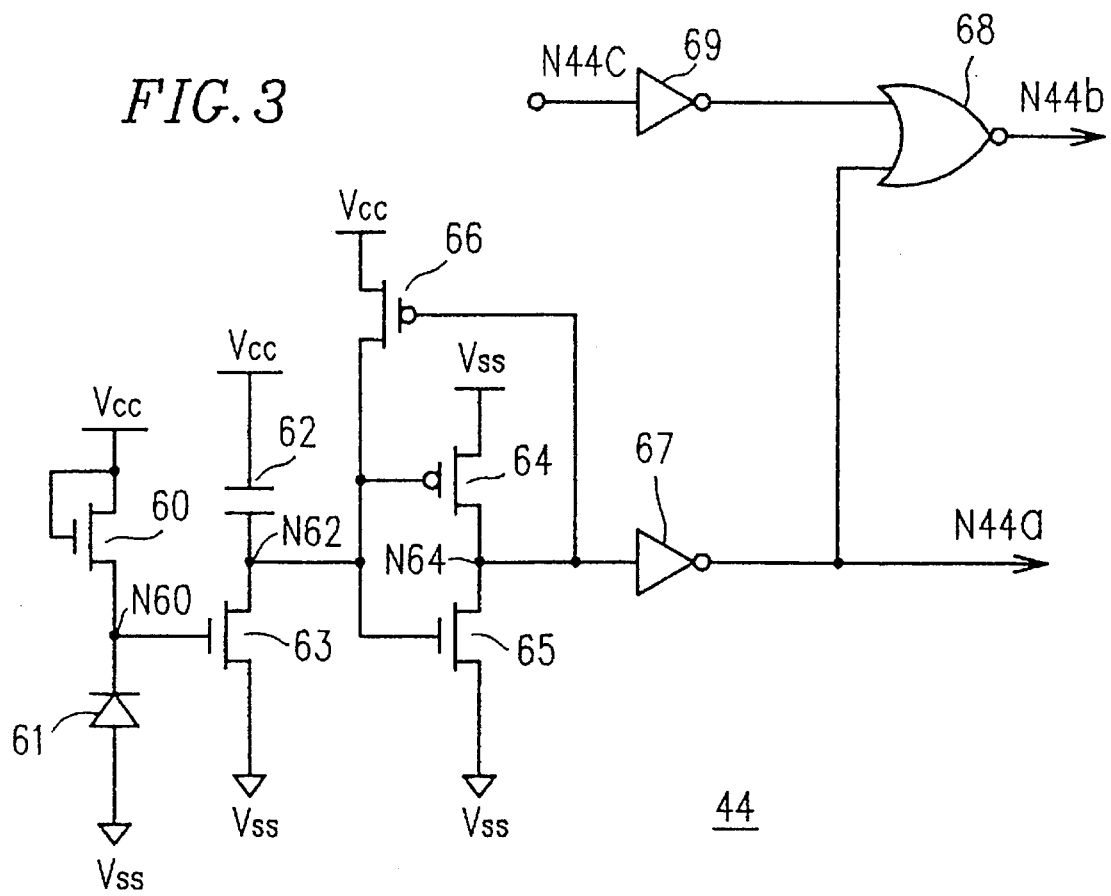
FIG. 3 is an exemplary circuit diagram of the control circuit shown in FIG. 2.

FIG. 3 is an exemplary circuit diagram of the control circuit 44 of FIG. 2.

In FIG. 3, a series circuit of a transistor 60 of the first conductivity type and a diode 61, that of a capacitor 62 and a transistor 63 of the first conductivity type, and that of a transistor 64 of the second conductivity type and a transistor 65 of the first conductivity type are respectively disposed between the Vcc and Vss potentials. The gate of the transistor 63 is connected to the junction of the transistor 60 and the diode 61, and the junction of the capacitor 62 and the transistor 63 is connected to the gates of the transistors 64 and 65. The gates of the transistors 64 and 65 are connected to the Vcc potential via a transistor 66 of the second conductivity type, and the gate of the transistor 66 is connected to the junction of the transistors 64 and 65. The junction of the transistors 64 and 65 is connected via an inverter 67 to the output N44a which is connected to one input terminal of a NOR gate 68. An input N44c is connected to the other input terminal of the NOR gate 68 via an inverter 69. The output terminal of the NOR gate 68 is connected to the output N44b.

The operation of the above-mentioned configuration will be described.

The transistors 33, 34 and 41 are turned off, and the transistors 38 and 40 are turned on during a given period, whereby the drains of the transistors 33 and 34 are precharged to the level of the Vcc potential. When the difference between the Vcc and Vss potentials is changed in a degree greater than a specific voltage, the transistors 33 and 34 are turned on. Thereafter, a current is made to flow through the transistors 31 and 32 so that the difference of the Vth values of the transistors 31 and 32 produces a difference between the drain voltages of the transistors 33 and 34. When one of the drain voltages of the transistors 33 and 34 is dropped to a level lower than a predetermined voltage which is approximately at an intermediate level between the Vcc and Vss potentials, the transistor 41 is turned on and the transistors 33 and 34 are turned off, in synchronization with the drop. This causes the drain voltages of the transistors 33 and 34 to enter a perfect bistable state.

The above-mentioned operation will be described in more detail with reference to FIGS. 4a to 4h.

It is assumed that the Vth of the transistor 31 is programmed so as to be 5 V or higher. In this case, the transistor 31 is programmed, for example, by the same method as that described in the related art section.

When the power source Vcc is turned on as shown in FIG. 4a, the voltage rises to the level of the Vcc potential. The control circuit 44 detects the rise of the power source Vcc, and outputs "H" level through the output N44a as shown in FIG. 4b. In the control circuit 44, immediately after the turn on of the power source Vcc, as shown in FIG. 3, the potential of an output N60 at the junction of the transistor 60 and the diode 61 is kept to be "L" level by the capacitance of the diode 61. The potential of an output N62 of the junction of the capacitor 62 and the transistor 63 is raised to "H" level by the capacitor 62 as a result of the turn off of the transistor 63. Therefore, the turn on of the transistor 65 causes an output N64 of the junction of the transistors 64 and 65 to be "L" level so that the potential of the output N44a of the control circuit 44 is set to be "H" level through the inverter 67. Thereafter, the potential of the output N60 is gradually charged to "H" level by the transistor 60. When the potential of the output N60 exceeds the threshold voltage of the transistor 63, the transistor 63 is turned on, and thereafter the potential of the output N62 is gradually lowered to "L". When the potential of the output N62 exceeds the turnover potential of the transistors 64 and 65 in the succeeding stage, the transistor 64 is turned on and the transistor 65 is turned off so that the output N64 is inverted to "H" and the output N44a is changed to "L" level. In this way, the output N44a of the control circuit 44 is "H" level during only a given period as shown in FIG. 4b after the turn on of the power source Vcc, and thereafter maintains "L" level.

During the period when the output N44a of the control circuit 44 is "H" level, the output N42 of the bias voltage generating circuit 42 is lowered to the Vss level as shown in FIG. 4c, and the transistors 31 and 32 remain turned off. At this time, the bias voltage generating circuit 43 outputs a voltage of about 2 V through the output N43 as shown in FIG. 4d.

When the output N44a of the control circuit 44 is "H" level, the output N45 of the inverter 45 is "L" level so that the P-channel transistors 38 and 40 in the CAM cell 53 are turned on. Therefore, an output N33 of the junction of the transistors 38 and 33 and an output N34 of the junction of the transistors 40 and 34 are precharged to the Vcc level as shown in FIGS. 4f and 4g. The output N48 of the NAND gate 48 is "L" as shown in FIG. 4h so that the output N49 of the inverter 49 is "H" level and the transistor 47 is turned on. When even one of the transistors 47 of all the CAM cells 53 is turned on, therefore, the input N44c of the control circuit 44 is lowered to "L" level because the input N44c is connected to the drains of the transistors 47 of all the CAM cells 53 in a wired-or manner and pulled up by one P-channel transistor 46 having a high impedance. Since the output N44a is "H" level and the input N44c is "L" level, the output N44b from the NOR gate 68 of FIG. 3 is "L" level. The above-mentioned operations are conducted during a certain period after the turn on of the power source Vcc, and the outputs N33 and N34 of all the CAM cells 53 are precharged.

When the output N44a of the control circuit 44 then returns to "L" level, the output N45 of the inverter 45 becomes "H" level and the transistors 38 and 40 which have precharged the outputs N33 and N34 are turned off. As shown in FIG. 4c, the change of the output N44a to "L" level causes the output N42 to change from "L" level to the Vcc potential so that, among the floating gate transistors 31 and 32, only the transistor 32 having a lower Vth allows a current to flow therethrough, with the result that the potential of the output N34 is gradually lowered from the Vcc level as shown in FIG. 4g. On the other hand, since the transistor 31 has a higher Vth value, the transistor 31 is turned off so that the potential of the output N33 is kept at the "H" level as shown in FIG. 4f. In other words, when the potential of the output N34 is lower than the input turnover level of the NAND gate 48 under the state where the potential of the output N33 is kept at the "H" level, the output N48 of the NAND gate 48 is inverted from "L" level to "H" level and the output N49 of the inverter 49 becomes "L" level so that the transistor 47 is turned off. The above-mentioned operations are conducted in all the CAM cells. When the NAND gates 48 of all the CAM cells 53 output "H" level, that is, the transistors 47 of all the CAM cells 53 connected to the input N44c are turned off, a bus for pulling down the input N44c to the Vss potential becomes extinct, and hence the input N44c of the control circuit 44 is raised to "H" level as shown in FIG. 4e by the pull-up P-channel transistor 46. Since the output N44a is "L" level, the change of the input N44c to "H" level causes the output N44b of the control circuit 44 to become "H" level through the NOR gate 68 shown in FIG. 3, and the transistor 41 is turned on. As shown in FIGS. 4g and 4h, therefore, "L" level of the output N34 and "H" level of the output N33 are held by the four transistors 35, 36, 37 and 39 which constitute a latch circuit. Since the potentials of the outputs N33 and N34 are held by the transistors 35, 36, 37 and 39, it is no longer required to make a current flow through the floating gate transistors 31 and 32. As shown in FIG. 4d, consequently, the output N43 of the bias voltage generating circuit 43 is controlled so as to be lowered completely to "L" level from the bias level of about 2 V.

The aforementioned operation is conducted in the semiconductor memory device of the present example after the turn on of the power source Vcc.

The potential of the output N11 is lowered to a voltage which is approximately twice (about 2 V) the Vth of the transistors 4 and 5, in order that, during the latch operation after the turn on of the power source, an excessive current is prevented from flowing through the floating gate transistors 2 and 3, and the Vth values of the transistors 2 and 3 are prevented from being changed by the voltage applied to the drains of the transistors 2 and 3 after the latch operation. In this example, the floating gate transistors 31 and 32 remain turned off and no voltage is applied to the drains of the transistors 31 and 32, and hence the drains, sources and gates of the floating gate transistors 31 and 32 have the same potential so that the escape of charges from the transistors 31 and 32 is reduced to a minimum level.

Hereinafter, replacement of defective memory cells by using a redundant circuit will be described.

The redundant circuit includes reserved memory cells which, when there exist defective memory cells, are to substitute for the defective memory cells. The redundant circuit stores the addresses of the defective memory cells, and replaces with the defective memory cells with the reserved memory cells.

Figure 5:
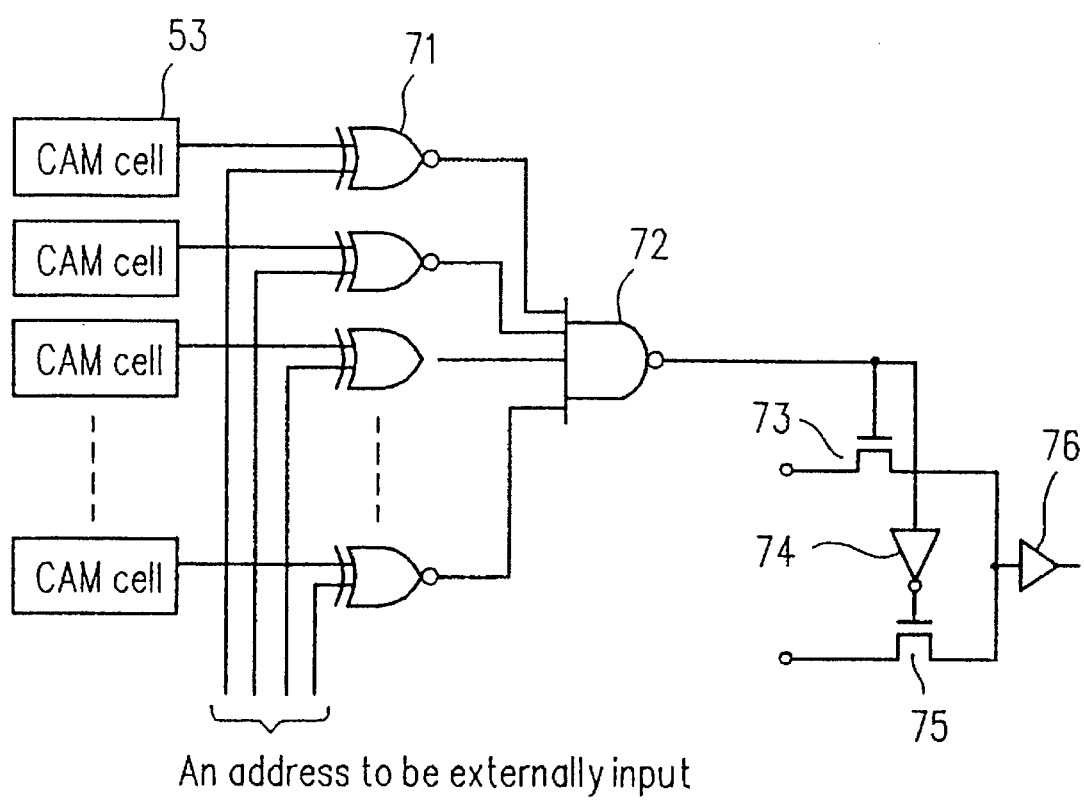
FIG. 5 is an exemplary circuit diagram of a switching circuit employed in the case where the CAM cells of FIG. 2 are used for storing redundant addresses.

FIG. 5 is an exemplary circuit diagram of a switch circuit employed in the case where the CAM cells 53 of FIG. 2 are used for storing redundant addresses.

In FIG. 5, the plurality of CAM cells 53 are connected to input terminals of EXNOR gates 71 which function as equality circuits, respectively. An address which is externally input is supplied to the other input terminals of the EXNOR gates 71. The output terminals of the plural EXNOR gates 71 are connected to input terminals of a multi-input NAND gate 72, respectively. The output terminal of the NAND gate 72 is connected to the gate of a transistor 73, and also to the gate of a transistor 75 via an inverter 74. The transistor 73, to which data from normal memory cells are input, is connected to an output buffer 76. Similarly, the transistor 75, to which data from the reserved (redundant) memory cells are input, is connected to the output buffer 76. Thus, either of the data are output through the output buffer 76.

In the above-mentioned configuration, the external addresses from the CAM cells 53 are compared in the EXNOR gates 71. When all the addresses coincide with each other, "L" level is output from the NAND gate 72 to turn on or off the transistors 73 and 75 so that the data from the normal memory cells are switched to those from the redundant memory cells.

Figure 6:
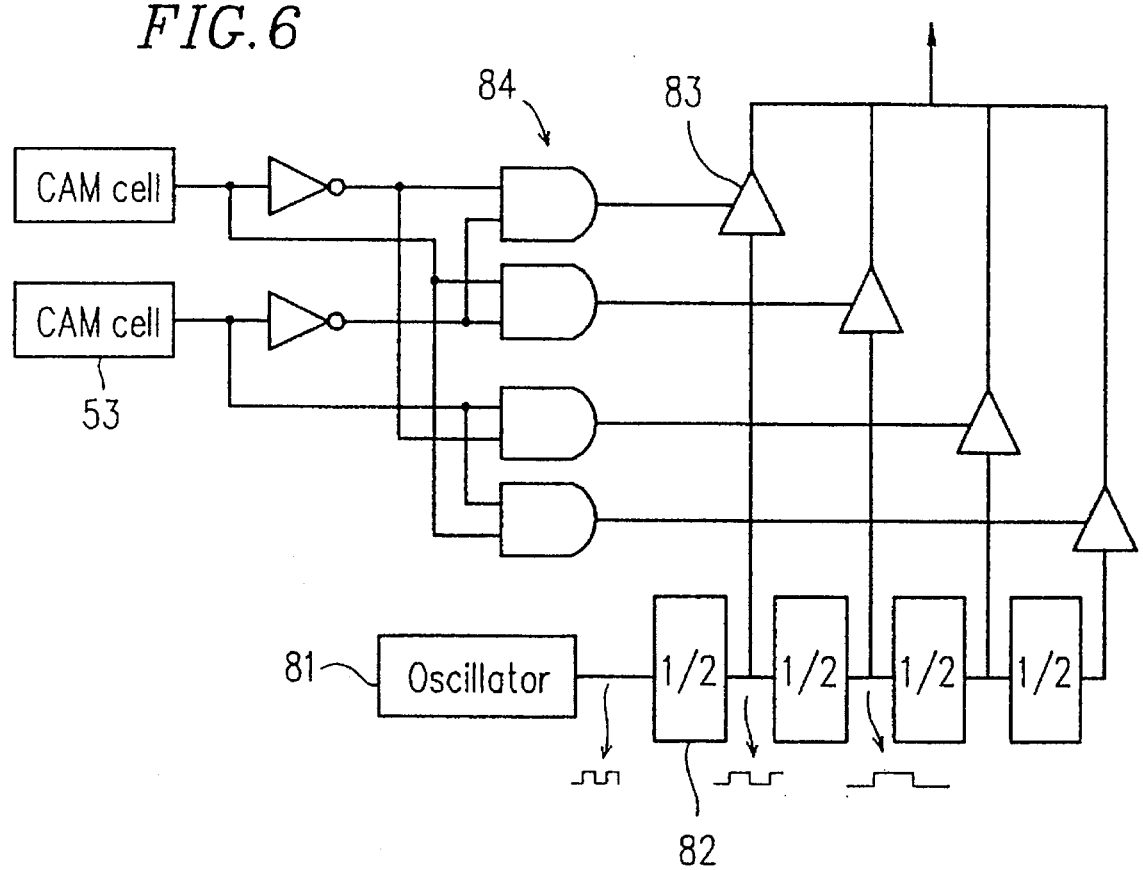
FIG. 6 is an exemplary circuit diagram of an initial state determining circuit employed in the case where the CAM cells of FIG. 2 are used for determining the initial state of the device.
Figure 7:
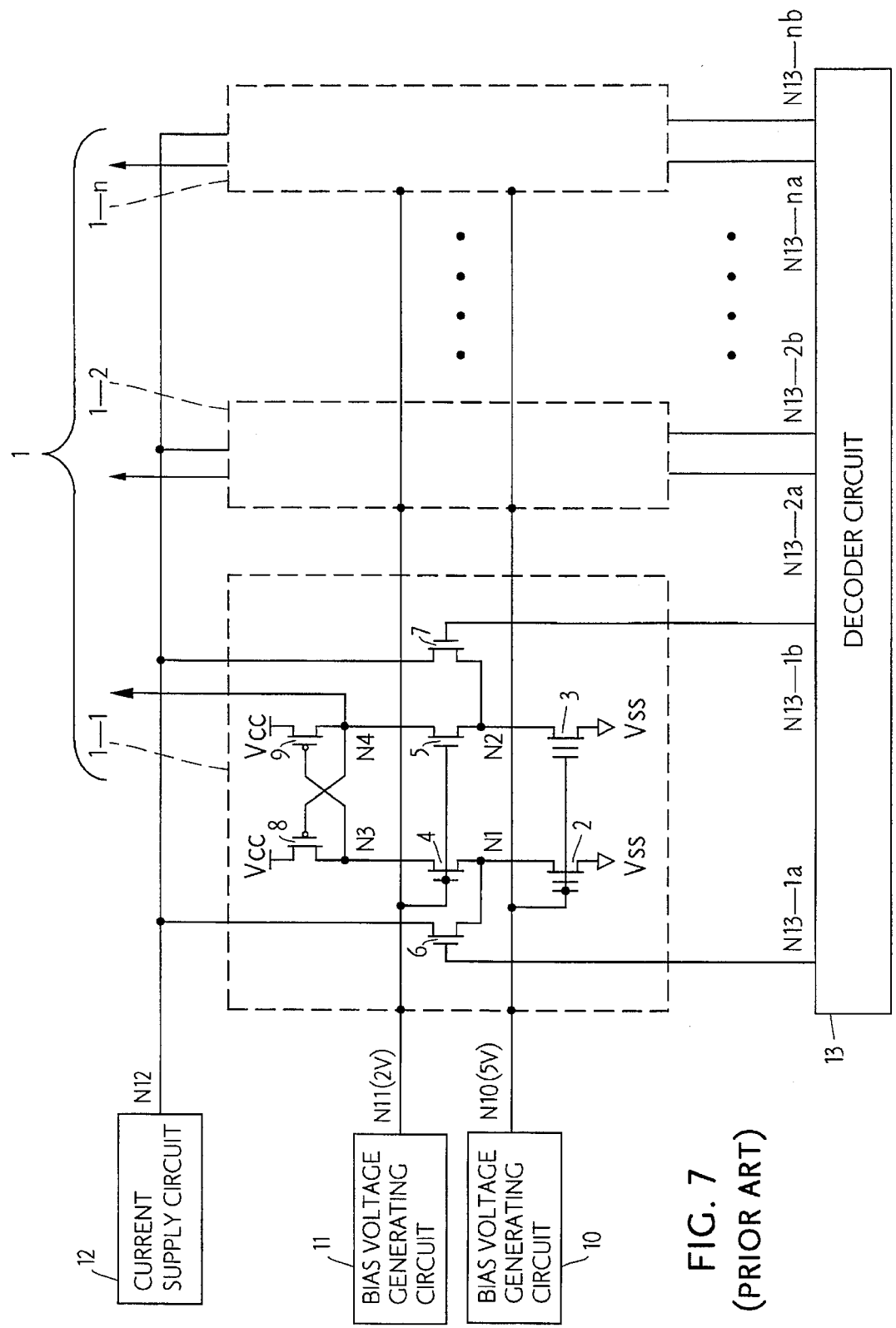
FIG. 7 is an exemplary circuit diagram of a conventional redundant defective address memory circuit employed in a conventional EPROM or flash memory.
Figure 8:
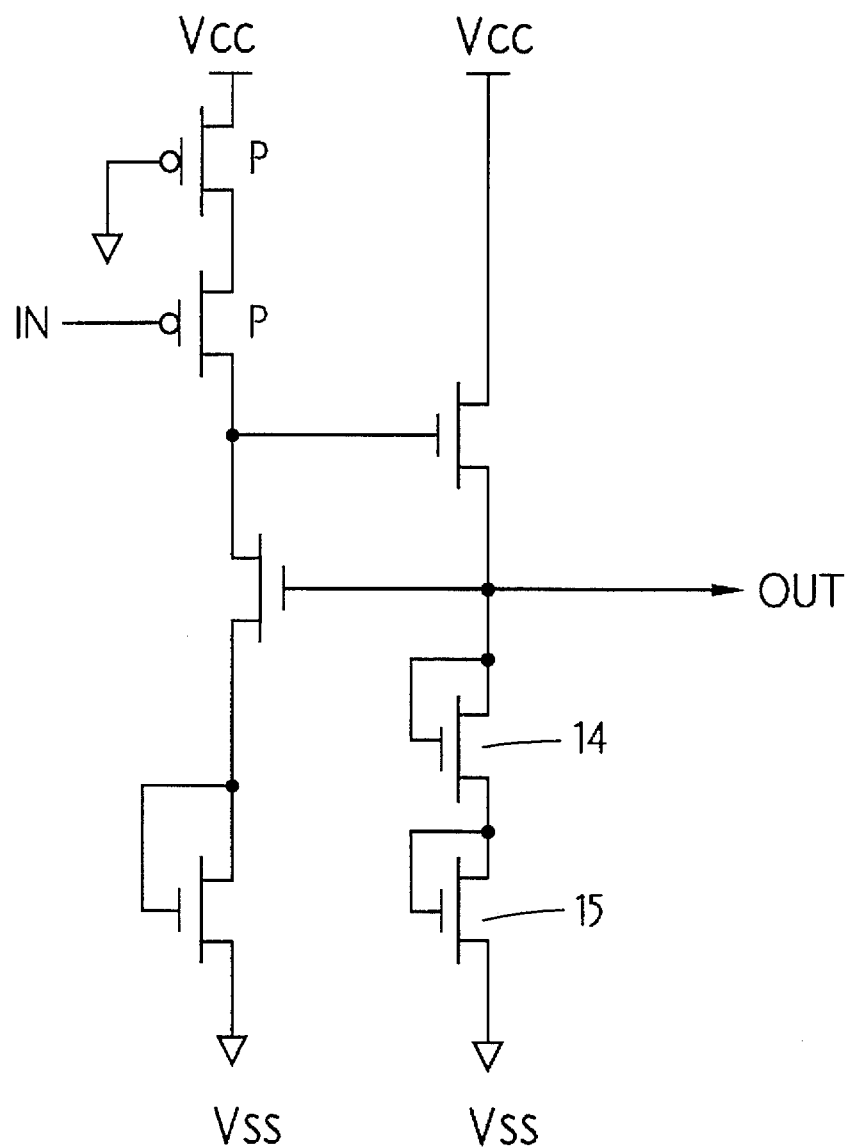
FIG. 8 is an exemplary circuit diagram of the bias voltage generating circuit shown in FIG. 7.

An initial state determining circuit of FIG. 6, in which the CAM cells 53 are used for determining the initial state of the device, is applicable to various circuits. In this example, an output frequency of an oscillator 81 is divided by $½$, $1/4$, $1/8$ and $1/16$ by a frequency divider 82 to obtain four kinds of frequencies, and the frequency to be used through analog switches 83 is selected via logic circuits 84 by the CAM cells 53. In the circuit, the dispersion of the oscillation frequency of the oscillation circuit due to process variation can be adjusted in the shipment test of the device.

Moreover, the CAM circuit according to the invention also gives consideration to the test easiness in the wafer test. In other words, the CAM circuit of the invention is designed so as not to impair the test easiness of the conventional circuit.

In the wafer test, all flash cells in the CAM cells are in the erase state (a low Vth state). In FIG. 2, the transistors 31 and 32 are in a state where the Vth values are low so that, when the power source Vcc is turned on, both the outputs N31 and N32 are "L" level. In a conventional circuit, this state is held and hence the output of the CAM cell becomes "L" level. In the conventional circuit, therefore, a CAM cell into which nothing is written outputs "L" level. As the test process advances, required CAM cells are sequentially subjected to a writing operation, whereby the redundancy is allowed to be rewritten in sequence.

In contrast, in the circuit of the invention, data is latched immediately after the turn on of the power source Vcc, and hence both the outputs N31 and N32 of a CAM cell into which nothing is written cannot be determined to be latched either to "L" level or "H" level. Unlike the conventional circuit, therefore, the circuit of the invention cannot conduct a process in which only required CAM cells are sequentially subjected to a writing operation.

In FIG. 2, therefore, a circuit 54 is connected to the output N44c of the control circuit 44. When a voltage of "H" level is applied to a pad 55 during a wafer test, the potential of the output N44c is set to "L" level through a transistor 56 irrespective of the state of the CAM cells 53. As far as the output N44c is "L" level, the bias voltage generating circuits 42 and 43 continue to operate and the CAM cells 53 do not start the operation of latching data. This means that the wafer test which is exactly identical with that of the conventional technique can be conducted under exactly the same state as that of the normal CAM cell, with the result that the conventional wafer test is not impaired.

As described above, according to the embodiment, a voltage is applied to the floating gate transistors of the CAM cells 53 only when the device is powered on, so that the above-mentioned latch operation is conducted. Thereafter, the CAM cells 53 are turned off and the separate second data holding circuits 24 hold the data, whereby a DC current consumed in a conventional use mode by the bias voltage generating circuits 42 and 43 and the floating gate transistors 31 and 32 can be completely eliminated. The control circuit 44 detects that all the CAM cells 53 substantially complete the sense operation, and generates a trigger signal for another second data holding circuits 24. Since the sense periods of the CAM cells 53 are different from each other because of the dispersion of the Vth values of the floating gate transistors 31 and 32 in the CAM cells 53, the completion of the sense operation of the CAM cell 53 which is slowest in sense operation is detected and then the trigger signal for the second data holding circuits 24 is generated.

The memory circuit has a further feature as follows: Generally, the absolute values of the Vth values of the transistors 33 and 34 holding the potentials of the outputs N13 and N14 are lower than those of the floating gate transistors 31 and 32. Therefore, the power source voltage may be decreased so as to be lowered to a level lower than the lowest Vth value of the transistors 31 and 32. Even in such a case, unless the power source voltage is lowered to a level lower than the Vth values of the holding transistors, the holding state can sufficiently be maintained and it is possible to endure variation of the power source voltage.

As described above, when such data are to be read out, a bias circuit is operated during only a period immediately after the power-on operation, to read out stored data, the data are then held in "separate" holding circuits (latch circuits), and bias voltage generating circuits and conventional holding circuits are turned off. Since the data remain to be output from the separate holding circuits (which do not consume a current), no current is consumed in the whole of the CAM circuit. The process of reading is conducted without passing through the bias voltage generating circuits, and hence the responsibility of data reading involves no problem. Even when the Vcc potential is varied, erroneous reading of data hardly occurs because the floating gate transistors 31 and 32 of the holding circuit are turned off and the "separate" holding circuit has a large margin with respect to the variation of the Vcc potential.

In a flash memory, a redundant cell portion is disposed at each end of divided blocks. The address of a defective cell among normal cells is stored in a CAM. The CAM always outputs the address information as data. When the address of the defective cell is externally accessed, therefore, data from the redundant cell is selected by an address judging circuit which is separately disposed.

In the above, the example in which a redundant address is programmed in a CAM has been described. Alternatively, it may be used while programming other data.

As described above, according to the invention, a control unit which controls a CAM is not required to always generate an intermediate potential, and floating gate transistors are turned off by turning off bias voltage generating circuits themselves. Therefore, a DC current is completely prevented from being consumed. Since a DC current is not consumed, it is not necessary to drive the bias voltage generating circuits. Since data is latched in a separate holding circuit, the waiting time which is conventionally required when the state is returned to the on state from the off state is not required, and the access time can be made equal to that of a normal read process. Therefore, the device can operate at a high speed.

In the conventional technique, when the power source voltage is varied or, for example, raised to a level higher than the Vth of a floating gate transistor, the transistor is turned on. In contrast, according to the invention, the transistor remains turned off in such a case, and hence the device is prevented from erroneously operating and consuming a DC current.

According to the configuration of the semiconductor memory device of the invention, unlike the conventional technique in which a binary data is held using first and second floating gate transistors, a data holding unit is disposed separately from the first and second floating gate transistors. A voltage difference is generated by the difference between the threshold voltages of the first and second floating gate transistors, and the voltage difference is stored in the form of a binary data. Thereafter, the first and second floating gate transistors are turned off.

In the conventional technique, a bias voltage is applied to the gates of the first and second floating gate transistors so that a minute current always flows. The amount of the minute currents are accumulated proportional to the number of cells, resulting in a large current. However, in the present invention, such a minute current is prevented from being generated so that the power consumption is reduced. Since the floating gate transistors are turned off, an erroneous operation which is a problem in the conventional technique can be eliminated.

When, the first and second floating gate transistors are turned off by turning off the first and second bias voltage generating units, both the above-mentioned power saving and the prevention of the generation of a minute DC current in the bias voltage generating units can be realized so as to further enhance the power saving. As described above, in the bias voltage generating units, an output bias voltage is obtained by passing a minute current through the transistors, and hence it requires a certain period of time to obtain an output bias voltage of a predetermined level. When the data is fetched from the data holding unit while the bias voltage generating units are turned off, however, the time period of operating the bias voltage generating units can be eliminated so that the device operates at a high speed.

Moreover since a transistor is further disposed in the upstream side of the floating gate transistors, a voltage to be applied to the floating gate transistors can be lowered so that the amount of charges escaping from the floating gate transistors is reduced.

Preferably, the drain voltage of the floating gate transistors may be set so as to be equal to the source voltage thereof. In this case, the escape of charges from the transistors can be reduced to a minimum level.

When the first and second floating gate transistors are turned off after the sensing operation of the data holding unit is completed, data can be held more surely. For example, switching elements may be driven using a detection output in which the voltage difference due to the difference of the threshold voltages of the first and second floating gate transistors is detected, and it is detected that all switching elements for each data holding unit are driven is detected. In this case, the circuit configuration can be made simple.

According to the semiconductor memory device of the invention, it is also possible to conduct the function that the voltage difference due to the difference of the threshold voltages of the first and second floating gate transistors can easily be held in the form of a binary data. For example, the data holding unit may be configured so that no DC current flows through the circuit in the data holding process.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a first floating gate transistor and a second floating gate transistor each storing charges, the amount of the charges stored in the first floating gate transistor being made different from that stored in the second floating gate transistor;

at least one control means for generating a voltage difference in accordance with respective threshold voltages of the first and second floating gate transistors, and for then turning off the first and second floating gate transistors; and at least one data holding means for holding the voltage difference as a binary data and wherein the control means detects completion of sensing operation of the data holding means, and turns off the first and second floating gate transistors after the detection.

2. A semiconductor memory device according to claim 1, wherein the control means further comprises at least one switching device provided as corresponding to each of the data holding means, the switching device being connected to a line pulled up to a first potential level, the switching device pulling down the potential level of the line to a second potential level, and wherein the control means drives the switching device using an output of the detection indicative of the voltage difference between the respective threshold voltages of the first and second floating gate transistors, and detects the completion of the sensing operation of the data holding means by detecting that each of the switching devices have been driven.

3. A semiconductor memory device according to claim 1, wherein the control means further comprises:

a first bias voltage generating means for supplying a bias voltage to a gate of each of the first and second floating gate transistors;

a first transistor of a first conductive type connected upstream to the first floating gate transistor in series;

a second transistor of the first conductive type connected upstream to the second floating gate transistor in series;

a second bias voltage generating means for supplying a bias voltage to a gate of each of the first and second transistors of the first conductive type, and wherein the first and second transistors of the first conductive type are turned off, thereby turning off the first and second floating gate transistors.

4. A semiconductor memory device according to claim 3, wherein the data holding means is connected between a first potential level and a second potential level via a switching transistor, wherein the first floating gate transistor is connected to the data holding means via the first transistor of the first conductive type, wherein the second floating gate transistor is connected to the data holding means via the second transistor of the first conductive type, and wherein the control means, when difference between the first and second potential levels changes beyond a predetermined extent, turns on the first and second transistors of the first conductive type so as to supply a current to the first and the second floating gate transistors, and thereafter turns on the switching transistor so as to turn off the first and second transistor of the first conductive type in a synchronizing manner with decreasing of a drain voltage of either the first and second transistors of the first conductive type to a prescribed intermediate level between the first and second potential levels.

5. A semiconductor memory device according to claim 4, wherein the data holding means further comprises:

a series circuit of a first transistor of a second conductive type and a third transistor of the first conductive type;

a parallel circuit of a second transistor of the second conductive type and a fourth transistor of the first conductive type, wherein a gate of the first transistor of the second conductive type and a gate of the third transistor of the first conductive type are connected to a junction between the second transistor of the second conductive type and the fourth transistor of the first conductive type, wherein a gate of the second transistor of the second conductive type and a gate of the fourth transistor of the first conductive type are connected to a junction between the first transistor of the second conductive type and the third transistor of the first conductive type, and wherein a voltage is applied to the first and second transistors of the second conductive type.

* * * * *